(12) United States Patent
Takada

(10) Patent No.: US 7,989,708 B2
(45) Date of Patent: Aug. 2, 2011

(54) MULTI-LAYER WIRING BOARD

(75) Inventor: Yoshifumi Takada, Hadano (JP)

(73) Assignee: Hitachi, Ltd., Tokyo (JP)

( * ) Notice: Subject to any disclaimer, the term of this patent is extended or adjusted under 35 U.S.C. 154(b) by 159 days.

(21) Appl. No.: 11/974,335

(22) Filed: Oct. 12, 2007

(65) Prior Publication Data
US 2008/0047744 A1 Feb. 28, 2008

Related U.S. Application Data

(63) Continuation of application No. 11/016,156, filed on Dec. 17, 2004, now Pat. No. 7,326,856.

(30) Foreign Application Priority Data

Dec. 19, 2003 (JP) ................................ 2003-421954

(51) Int. Cl.
*H05K 1/11* (2006.01)
(52) U.S. Cl. ........................ 174/262; 361/794
(58) Field of Classification Search .......... 174/262–266; 361/792–795
See application file for complete search history.

(56) References Cited

U.S. PATENT DOCUMENTS

| 3,571,923 | A | * | 3/1971 | Shaheen et al. ................. 29/852 |
| 5,543,586 | A | | 8/1996 | Crane et al. |
| 5,847,936 | A | | 12/1998 | Forehand et al. |
| 6,040,524 | A | * | 3/2000 | Kobayashi et al. ............. 174/36 |
| 6,329,604 | B1 | | 12/2001 | Koya |
| 6,512,181 | B2 | | 1/2003 | Okubo et al. |
| 6,791,035 | B2 | | 9/2004 | Pearson et al. |
| 2005/0063166 | A1 | | 3/2005 | Boggs et al. |

FOREIGN PATENT DOCUMENTS

| JP | 03-145791 A | 6/1991 |
| WO | WO01/56338 | 8/2001 |

* cited by examiner

*Primary Examiner* — Jeremy C Norris
(74) *Attorney, Agent, or Firm* — Kilpatrick Townsend & Stockton LLP

(57) ABSTRACT

In a multi-layer wiring board in which board wirings are arranged in a plurality of wiring layers so as to be connected via a through hole, two through holes are provided in parallel, and two through holes are connected therebetween in both end portions of the respective through holes or one end portion thereof by the wiring board.

1 Claim, 13 Drawing Sheets

MULTI-LAYER WIRING BOARD

INCORPORATION BY REFERENCE

The present application claims priority from Japanese application JP2003-421954 filed on Dec. 19, 2003, the content of which is hereby incorporated by reference into this application.

BACKGROUND OF THE INVENTION

The present invention relates to a structure of a through hole and a pattern of a multi-layer wiring board, and a design thereof.

In a high speed signal transmission circuit for transmitting a signal at a pitch equal to or more than a gigahertz, there are problems that a signal attenuation is increased in a board wiring, a cable and the like, and an influence of an impedance mismatch reflection is increased due to a parasitic capacity in a connected portion (a through hole) to an LSI, a part or the like. As a prior art for reducing the influence of the reflection in the through hole portion, there has been a technique that the parasitic capacity of a stub in the through hole 1 is removed by drilling a hole in the stub portion of the through hole 1 by a back drill 9 as described in PCT WO 01/56338 A1, for example, shown in FIG. 2A. Further, there has been a technique using a BGA connection portion 12 and a micro via hole 10 without using the through hole as shown in FIG. 2B.

SUMMARY OF THE INVENTION

A description will be given of an influence of the stub in the through hole.

FIGS. 3A and 3B are board cross sectional views of a connection portion between a through hole 1 connecting a signal to parts and a board wiring 2, in a general multi-layer wiring board, in which FIG. 3A shows a case that the wiring exists on an upper layer of the board, and FIG. 3B shows a case that the wiring exists on a lower layer of the board. A portion called stub 17 is generated in the through hole in the case shown in FIG. 3A. FIG. 4A is a view explaining the parasitic capacity of the stub, in which a parasitic capacity 15 between a power source and a ground pattern generated in the stub portion of the through hole 1 branched from a signal transmission path 14 is connected to the signal transmission path 14. FIG. 4B is a view explaining this matter on the basis of the transmission path, in which the signal is transmitted on a transmission path 16 in an outer side of the board such as the parts or the like, and no reflection is generated at a time when these two transmission paths have the same characteristic impedance Zo. However, a capacitive reflection is generated in the case that the parasitic capacity 15 of the stub is connected. This generates a fault of the high speed signal transmission.

In a technique to which a back drill 9 is applied shown in FIG. 2A corresponding to an example of the prior art, it is necessary to newly add a drill step for removing the stub to a board manufacturing process, and there is a problem that a cost increase is caused. Further, in a structure made such that a connection pin 8 for parts is inserted to the through hole as shown in FIG. 3A, since a hole can not be formed to the pin portion by the drill, there is a problem that the stub portion may not be sometimes completely removed.

Further, in the case of using a micro via hole as shown in FIG. 2B corresponding to the other example of the prior art, since a step of a partial lamination, a partial drill or the like is generated in the board manufacturing process, there is a problem that a cost increase is caused.

An object of the present invention is to remove a parasitic capacity due to a stub of a through hole without increasing a cost, on the basis of a design technique employing a new board structure, without using a specific board manufacturing process. Further, the other object of the present invention is to achieve a structure for removing the parasitic capacity due to the stub, even in the case that the structure is made such that the connection pin 8 is inserted to the through hole 6 as shown in FIG. 1.

In order to achieve the object mentioned above, a through hole 7 (a conversion through hole) for changing a layer of a signal wiring is placed near a through hole 6 (a part through hole) for connecting to a part or the like which is mounted on the board as shown in FIG. 1, and patterns 11a and 11b connecting the through holes are provided in both or one of end portions of the part through hole 6 and the conversion through hole 7. Accordingly, the stub extra connecting is removed from the connection portion between the through hole and the wiring so as to reduce the parasitic capacity of the through hole. Therefore, it is possible to reduce the influence of the reflection caused by the impedance mismatch of the through hole portion in the high speed signal transmission.

In accordance with the present invention, since it is possible to reduce the influence of the stub parasitic capacity of the through hole without using the specific board manufacturing process, there can be obtained an effect that it is possible to achieve a multi-layer wiring board suitable for the high speed signal transmission without increasing the cost.

Other objects, features and advantages of the invention will become apparent from the following description of the embodiments of the invention taken in conjunction with the accompanying drawings.

DESCRIPTION OF PREFERRED EMBODIMENTS

A description will be given below of an embodiment in accordance with the present invention with reference to FIGS. 1, 5, 6, 7 and 9.

Figure 1:
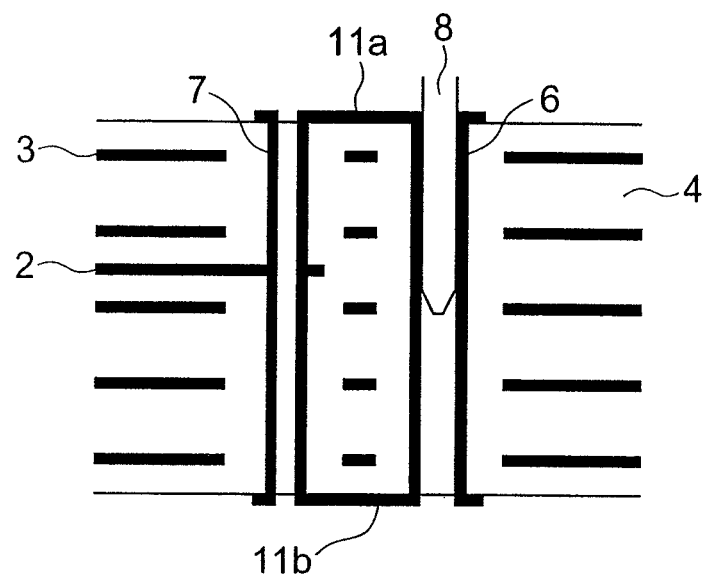
FIG. 1 is a board cross sectional view of a through hole portion of a multi-layer wiring board in accordance with an embodiment of the present invention.
Figure 2A:
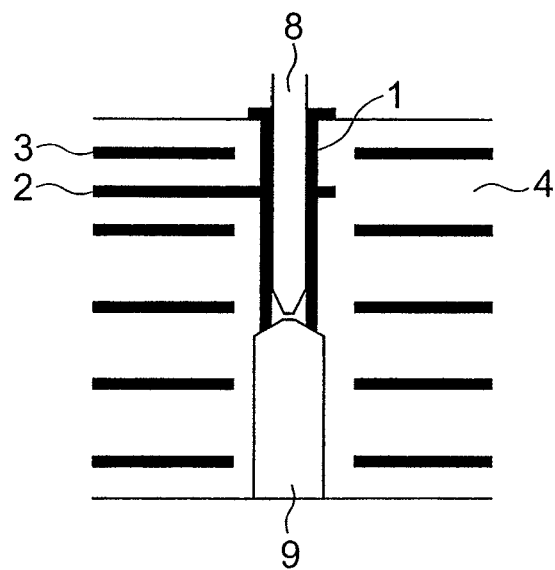
FIG. 2A is a board cross sectional view in a case that a back drill is applied, in accordance with the conventional art.
Figure 2B:
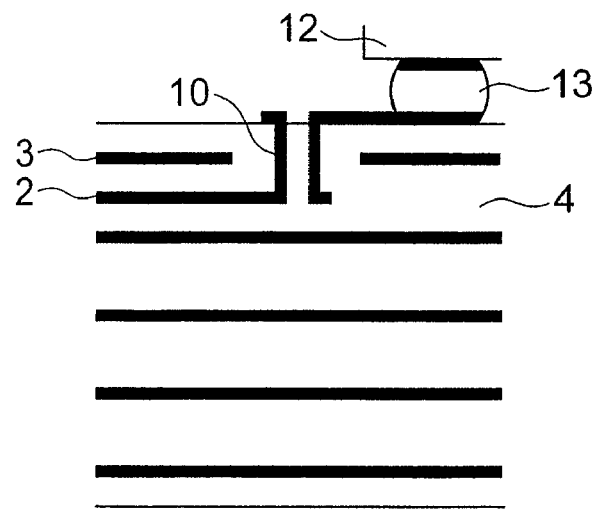
FIG. 2B is a board cross sectional view in a case of utilizing a BGA part and a micro via hole, in accordance with the conventional art.
Figure 3A:
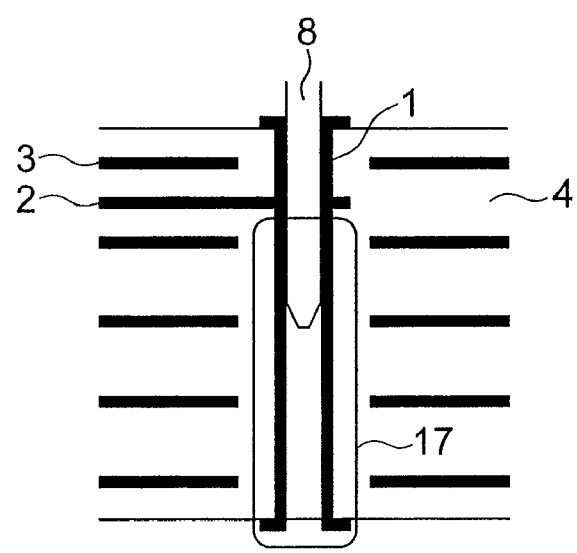
FIG. 3A is a board cross sectional view in a case that a wiring exists on an upper wiring layer, in accordance with the conventional art.
Figure 3B:
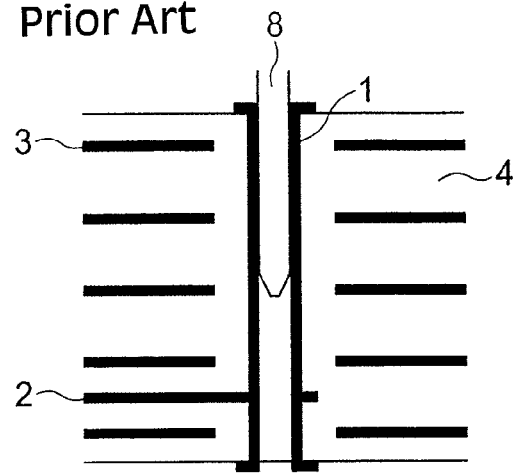
FIG. 3B is a board cross sectional view in a case that the wiring exists on a lower wiring layer, in accordance with the conventional art.
Figure 4A:
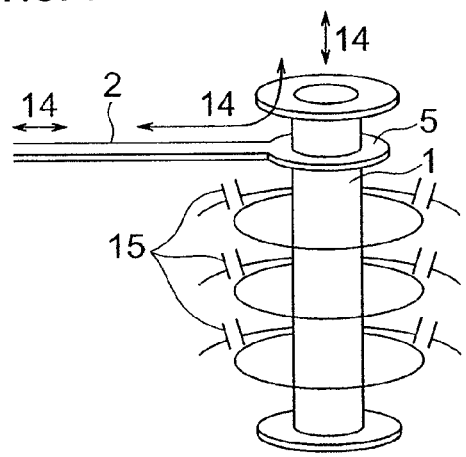
FIG. 4A is a perspective view for explaining an influence by the stub in the case of the upper layer wiring, in accordance with the conventional art.
Figure 4B:
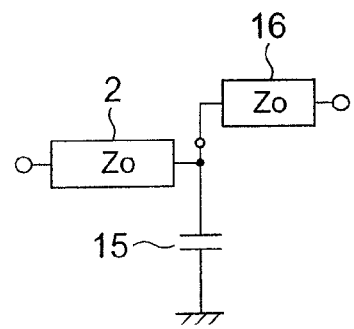
FIG. 4B is a view for explaining a transmission circuit in the case of the upper layer wiring, in accordance with the conventional art.

FIG. 1 shows an embodiment in the case that a connection pin 8 for a part is provided in a part through hole 6, in which a conversion through hole 7 is provided near the part pin 8 so as to connect a board wiring. The structure is made such that the conversion through hole 7 and the part through hole 6 are connected therebetween by both of a pattern 11a on a board upper surface and a pattern 11b on a board lower surface.

Figure 5:
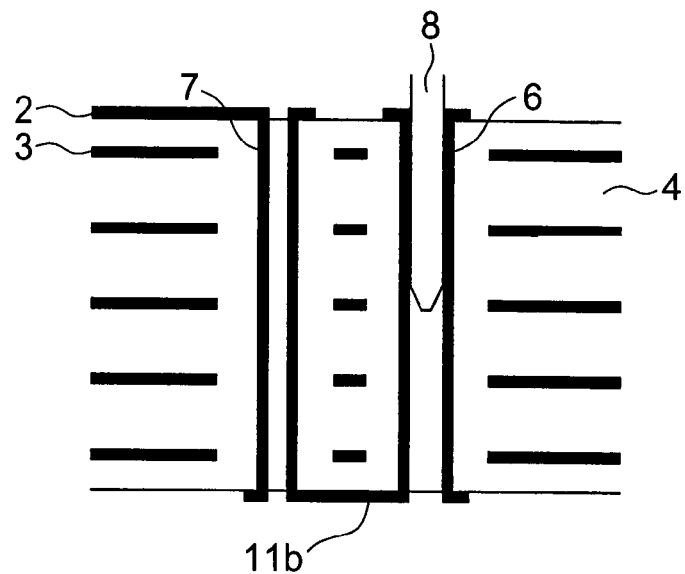
FIG. 5 is a board cross sectional view in the case of the uppermost layer wiring, in accordance with an embodiment of the present invention.

FIG. 5 shows a structure of the embodiment shown in FIG. 1, in which a connection pattern of the conversion through hole 7 and the part through hole 6 is connected only by a board lower surface. In the case that the board wiring 2 is constituted by an uppermost layer or a layer on the board upper portion close thereto, it is possible to connect only by the pattern 11b on the board lower surface as shown in FIG. 5.

Figure 6:
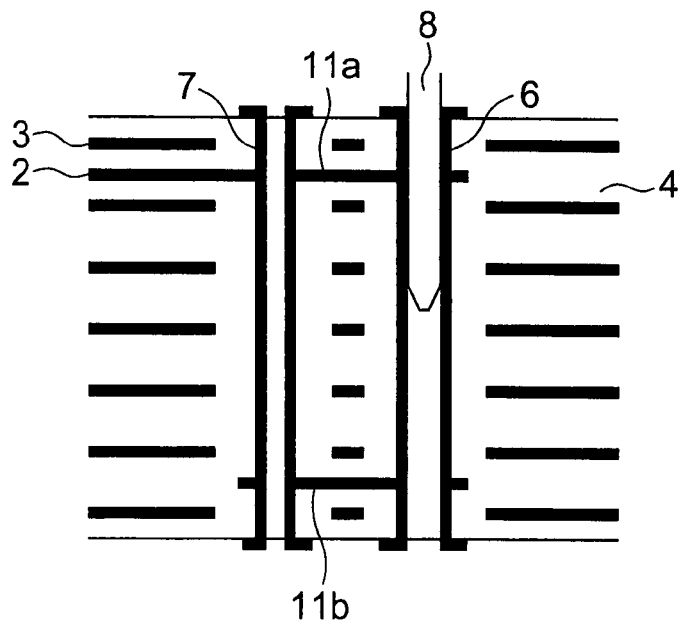
FIG. 6 is a board cross sectional view in the case that two through holes are connected therebetween by a board internal wiring, in accordance with the embodiment of the present invention.

FIG. 6 shows a case that the patterns 11a and 11b connecting between the conversion through hole 7 and the part through hole 6 are constituted by an upper layer or a lower layer in a board inner layer in the structure shown in FIG. 1. In this case, a short stub portion is generated in the through hole, however, an influence of the stub can be made smaller to a level generating no problem by setting the stub as close as possible to the board surface. In the case that the board wiring 2 is constituted by the uppermost layer or the layer in the upper portion of the substrate close thereto in the same manner as that in FIG. 5, the connection can be achieved only by the connection pattern 11b in the board lower layer.

Figure 7:
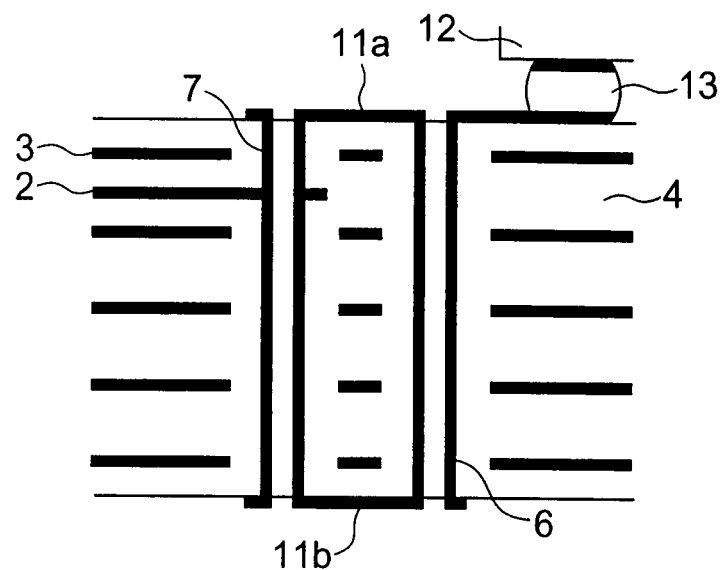
FIG. 7 is a board cross sectional view in the case of connecting to the BGA part, in accordance with the embodiment of the present invention.

FIG. 7 shows a structure in the case that no connection pin is necessary, such as the case that the part mounted on the board is constituted by a ball grid array (BGA) connection or the like. In this case, since the part through hole 6 can be formed as a small-diameter through hole, there can be obtained an advantage that a freedom of design is high.

Figure 8:
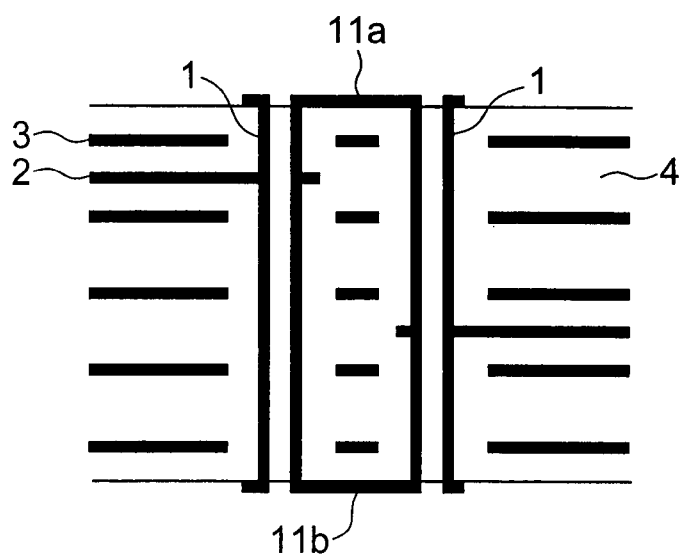
FIG. 8 is a board cross sectional view in the case of changing a wiring layer of the board wiring, in accordance with the embodiment of the present invention.

FIG. 8 shows an embodiment in which the present invention is applied to a through hole in the case that the layer of the board wiring is changed.

Figure 9:
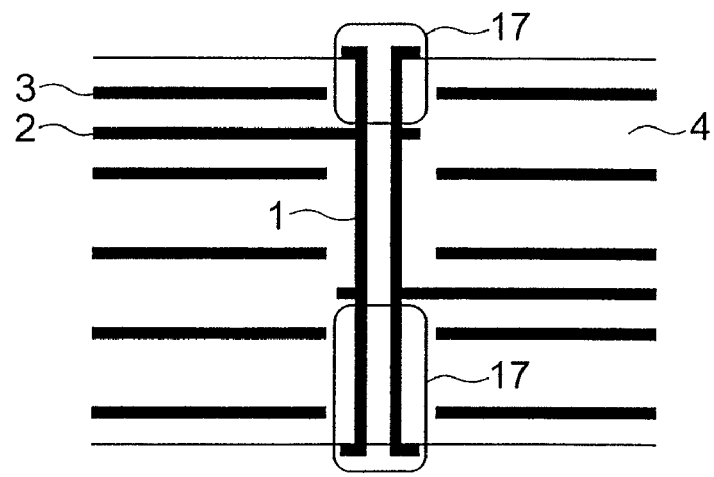
FIG. 9 is a board cross sectional view in the case of changing the wiring layer of the board wiring, in accordance with the conventional art.

FIG. 9 shows a conventional structure in the case that the layer of the board wiring in FIG. 8 is changed. In the case of using one through hole 1, a stub 17 is generated and a reflection is generated by a parasitic capacity. On the contrary, in the embodiment shown in FIG. 8, the influence of the stub can be reduced by using two through holes 1a and 1b and connecting therebetween.

A description will be given below of a technical content of the present invention. In this case, FIGS. 10A, 11, 12A, 12C, 13, 14A and 15A are perspective views in which an insulating member, a power source and a ground pattern are removed for understandably explaining.

Figure 10A:
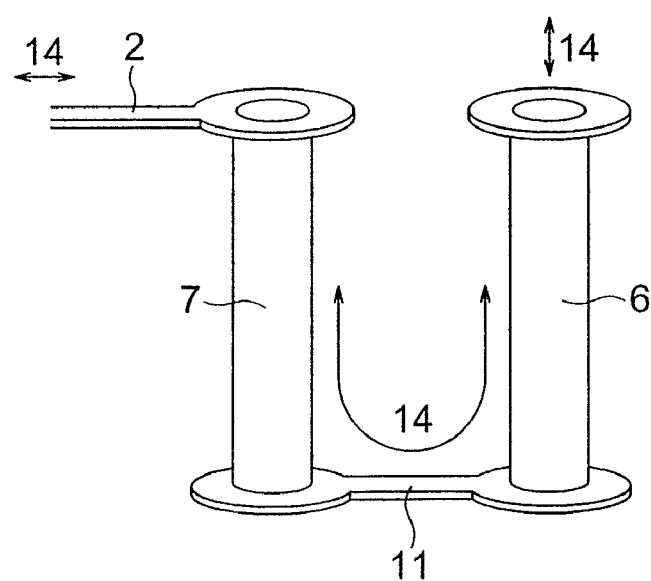
FIG. 10A is a perspective view for explaining a signal transmission path in the case of the uppermost layer wiring, in accordance with the embodiment of the present invention.

FIG. 10A shows a structure in the case that the board wiring 2 is constituted by the uppermost layer of the board, in accordance with the embodiment of the present invention. The uppermost layer wiring is connected to the part through hole 6 in the lowermost layer via the conversion through hole 7. At this time, the signal transmission path is formed as a path 14, and the stub which does not contribute to the signal transmission path does not exist.

Figure 10B:
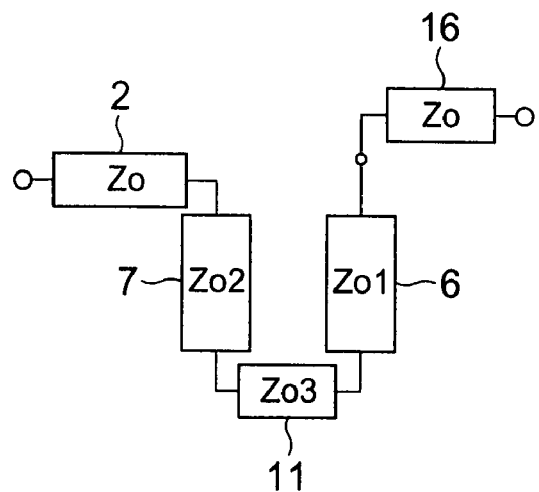
FIG. 10B is an explanatory view of a transmission path impedance in the case of the uppermost layer wiring, in accordance with the embodiment of the present invention.

FIG. 10B is a view showing the embodiment in FIG. 10A on the basis of a connection of the transmission path, in which it is known that the signal is transmitted as a series of transmission path in a state in which the stub is not generated in the through hole. In this case, a characteristic impedance Zo2 of the transmission path of the conversion through hole, a characteristic impedance Zo1 of the transmission path of the part through hole, and a characteristic impedance Zo3 of the transmission path of the connection pattern are designed so as to coincide with a characteristic impedance Zo of the other transmission paths or become a value close to the characteristic impedance Zo under an actual restriction. Accordingly, it is possible to obtain an improved characteristic having a small amount of impedance mismatch reflection. The characteristic impedance of the through hole is designed so as to optimize a through hole diameter, a clearance diameter, a power source and ground pin layout and the like.

Figure 11:
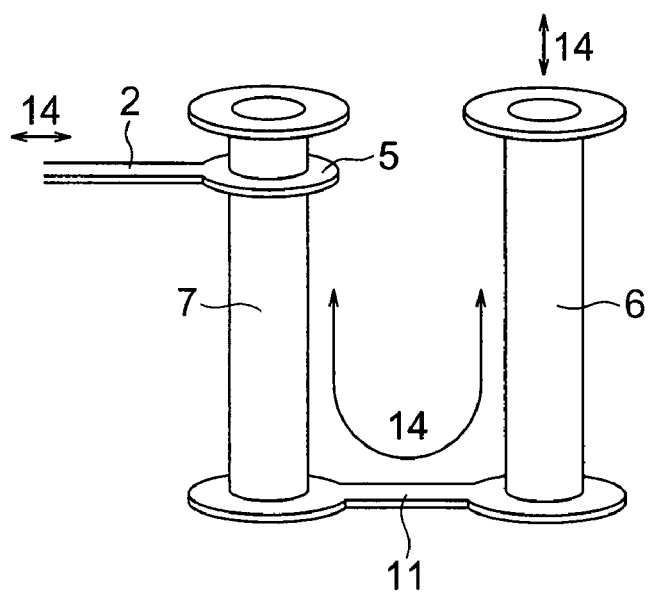
FIG. 11 is a perspective view for explaining a signal transmission path in the case of the uppermost layer wiring, in accordance with the embodiment of the present invention.

FIG. 11 shows a case that the board wiring corresponding to the uppermost layer wiring in FIG. 10A is constituted by the upper layer in an inner portion of the board. At this time, a short stub is generated in an upper portion of the conversion through hole. In the case that a length of the stub is short and the parasitic capacity is small, it is possible to obtain an improved characteristic by employing the same structure as that in FIG. 10A.

Figure 12A:
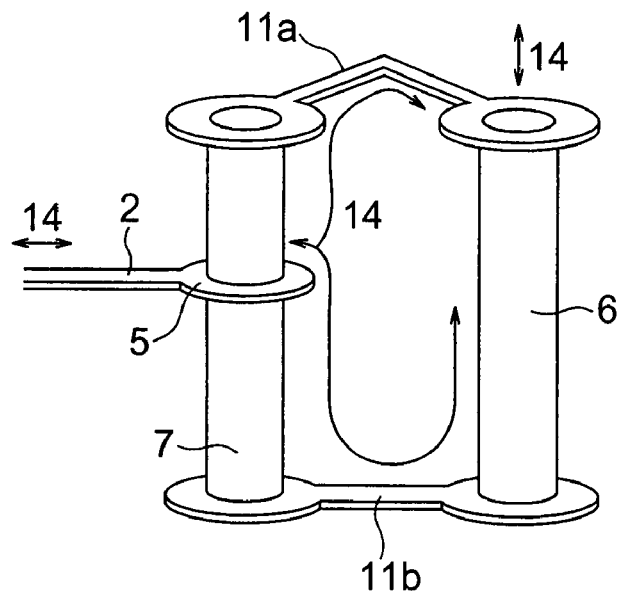
FIG. 12A is a perspective view for explaining a signal transmission path in the case of an intermediate layer wiring, in accordance with the embodiment of the present invention.

FIG. 12A shows a case that the board wiring 2 exists in an intermediate portion corresponding to a further lower layer. In this case, in the structure shown in FIG. 11, the stub in the upper portion of the conversion hole becomes long. Accordingly, in the embodiment shown in FIG. 12A, the connection between the conversion through hole 7 and the part through hole 6 is executed by the uppermost layer pattern 11a in addition to the lowermost layer pattern 11b. The signal transmission path at this time is formed as the path 14, and is branched into two paths comprising the uppermost layer and the lowermost layer in upper and lower ends of the through hole so as to transmit the signal.

Figure 12B:
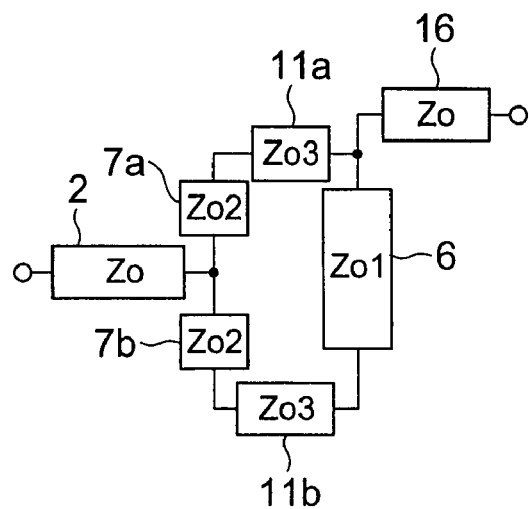
FIG. 12B is a view for explaining a transmission circuit in the case of the intermediate layer wiring, in accordance with the embodiment of the present invention.
Figure 12C:
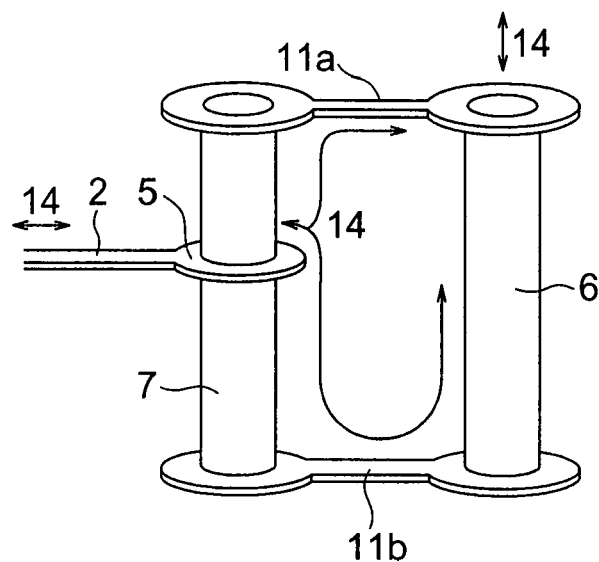
FIG. 12C is a perspective view for explaining a signal transmission path in the case of the intermediate layer wiring, in accordance with the embodiment of the present invention.

FIG. 12B is a view showing this on the basis of the connection of the transmission path. Two transmission paths exist between the board wiring 2 and the transmission path 16 for the parts, and are constituted by a path along a conversion through hole upper portion 7a and the uppermost layer pattern 11a, and a path along a conversion through hole lower portion 7b, the lowermost layer pattern 11b and the part through hole 6. Accordingly, the characteristic impedances Zo2, Zo3 and Zo1 of the transmission path in the branched portion are set to about two times of the other transmission system characteristic impedance Zo and are designed such that the impedance matching is obtained on the basis of the effect that two paths are input in parallel. Further, in the case that the connection patterns 11a and 11b have an identical structure, a difference in length corresponding to the part through hole is generated between two branched transmission paths. At this time, there is a possibility that a reflection is generated due to the difference in length between two paths. Accordingly, in FIG. 12A, the difference in length between the paths is adjusted by elongating the length of the connection pattern 11a of the uppermost layer. In an embodiment shown in FIG. 12C, in order to save a bypass area of the uppermost layer connection pattern in FIG. 12A, there is provided an embodiment which is designed to make the reflection by the difference in path by forming the lowermost layer wiring pattern 11b by a thick wiring.

Figure 13:
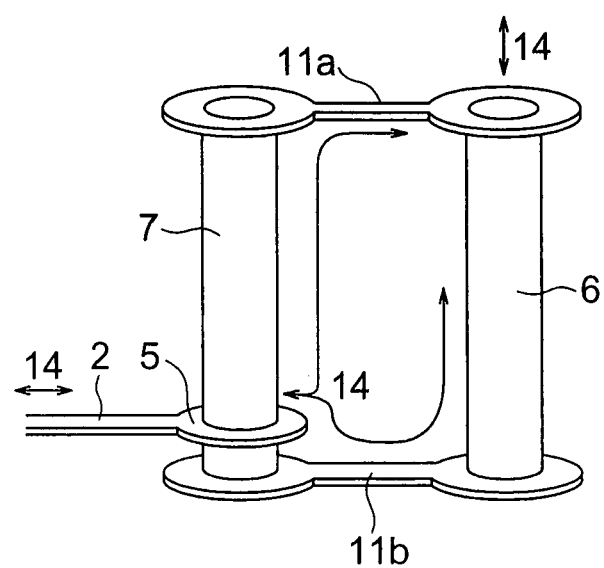
FIG. 13 is a perspective view for explaining a signal transmission path in the case of the lower layer wiring, in accordance with the embodiment of the present invention.

FIG. 13 is an embodiment in the case that the board wiring 2 exists in the lower layer in a further lower side of the board. At this time, two through holes are connected therebetween by both of the uppermost layer connection pattern 11a and the lowermost layer connection pattern 11b, however, since the difference in path length between two branched paths becomes small, no problem is generated even in the case that the uppermost layer connection pattern 11a and the lowermost layer connection pattern 11b have the same structure.

Figure 14A:
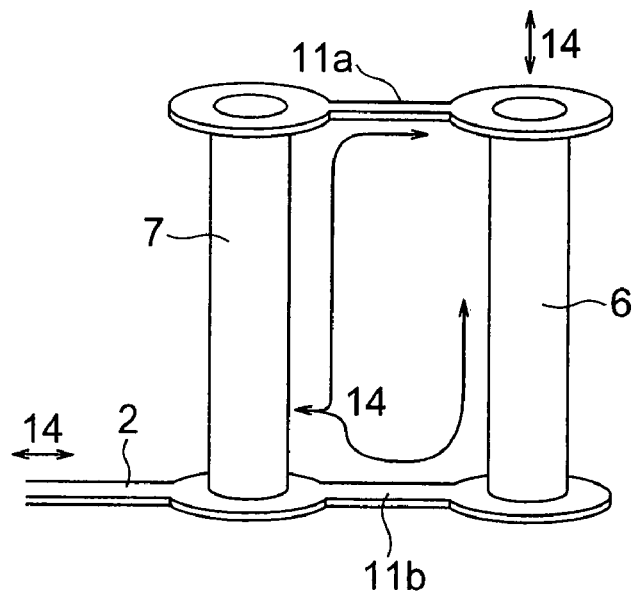
FIG. 14A is a perspective view for explaining a signal transmission path in the case of the lowermost layer wiring, in accordance with the embodiment of the present invention.
Figure 14B:
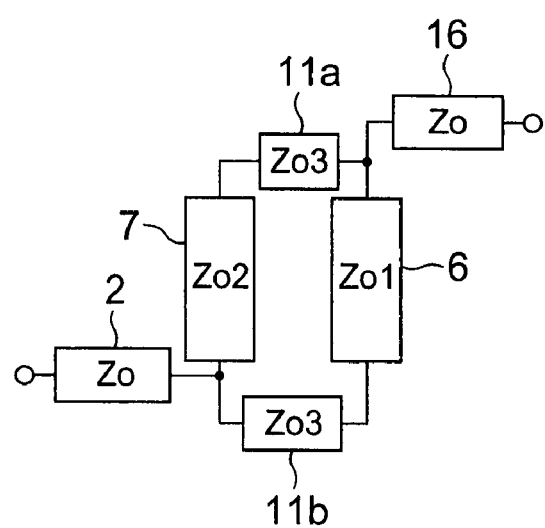
FIG. 14B is a view for explaining a transmission circuit in the case of the lowermost layer wiring, in accordance with the embodiment of the present invention.

FIG. 14A is a schematic view of the transmission path in the case of the lowermost layer board wiring. At this time, no difference in path length exists between two paths, and the influence of the reference is reduced by designing the transmission path characteristic impedances Zo2, Zo3 and Zo1 shown in FIG. 14B to be about two times of the other transmission path characteristic impedance Zo so as to set to a value close to Zo at a time when two paths are in parallel.

Figure 15A:
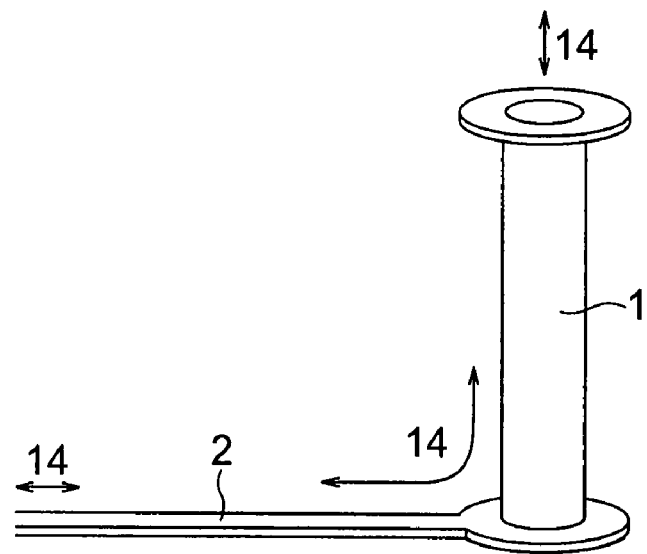
FIG. 15A is a perspective view for explaining the signal transmission path in the case of the lowermost layer wiring.
Figure 15B:
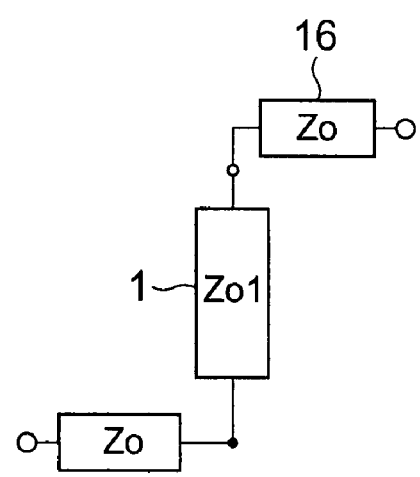
FIG. 15B is a view for explaining the transmission circuit in the case of the lowermost layer wiring.

Further, in the case that the board wiring exists in the lowermost layer, no stub exists even by employing one through hole in accordance with the conventional art as shown in FIG. 15A. Accordingly, an improved characteristic can be obtained. The connection of the transmission path in this case is shown in FIG. 15B, and in order to reduce the influence of the reflection, the characteristic impedance Zo1 of the through hole 1 is designed to be close to the other transmission system characteristic impedance Zo.

Figure 16:
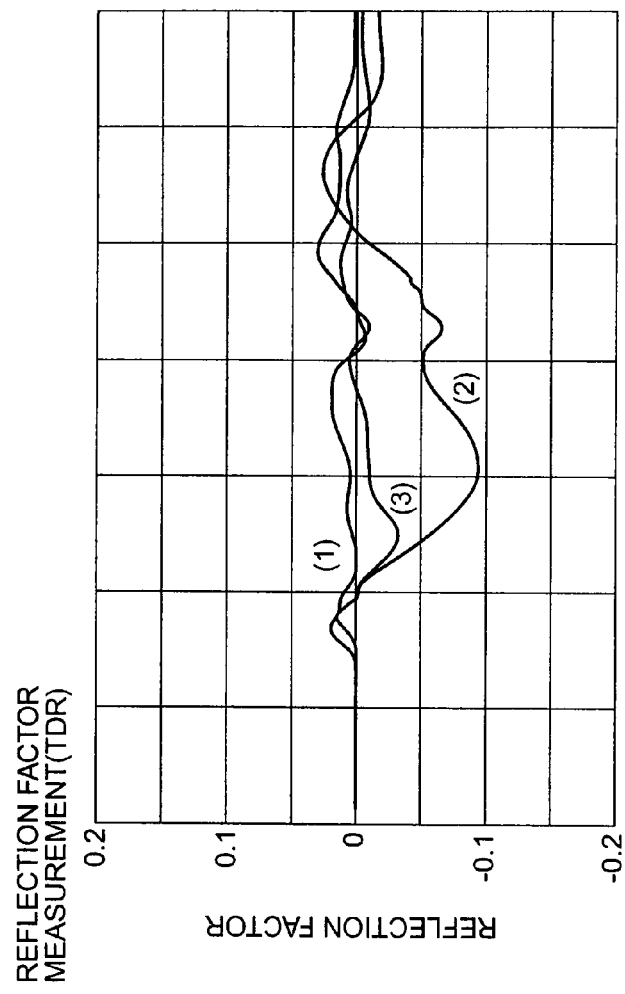
FIG. 16 is a view showing a reflection factor measurement result for explaining an effect of the embodiment in accordance with the present invention.
Figure 16:
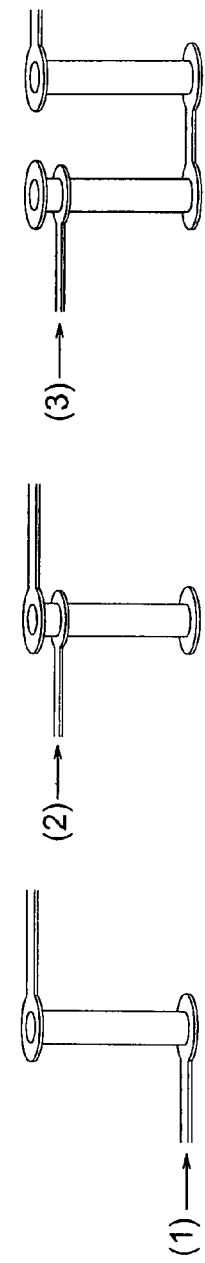
Figure 17:
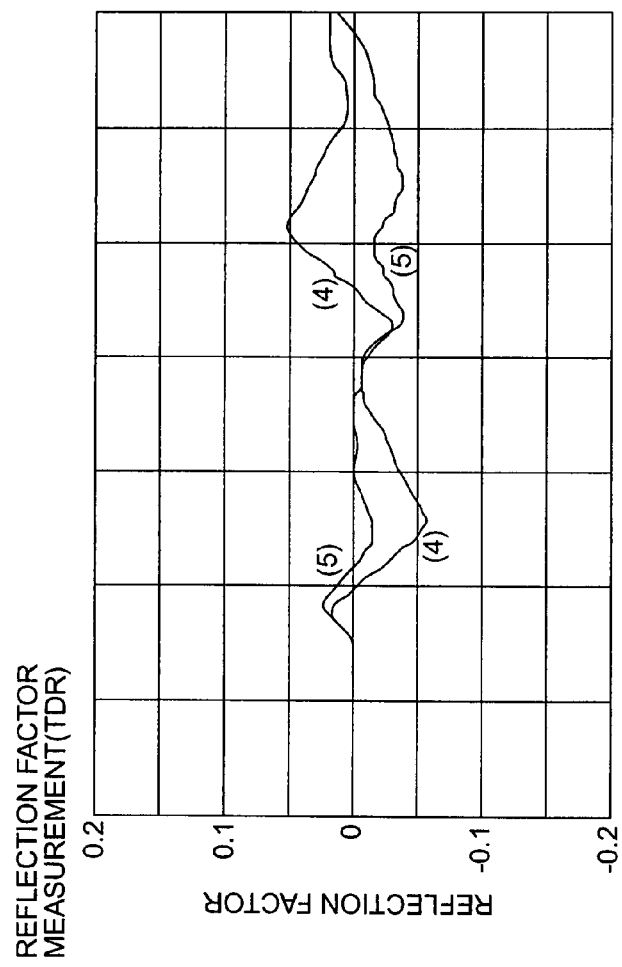
FIG. 17 is a view showing the reflection factor measurement result for explaining the effect of the embodiment in accordance with the present invention.
Figure 17:
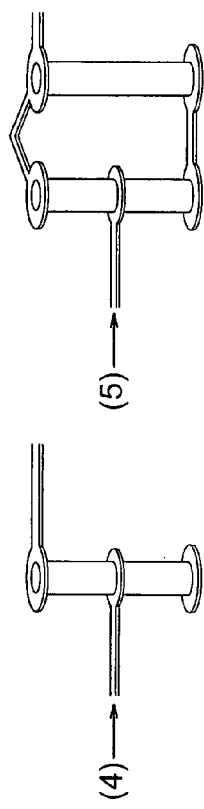

FIGS. 16 and 17 show a result obtained by executing a measurement called as a time domain refrectometry (TDR) for measuring a reflection factor of the through hole portion, in order to confirm the result of the present invention.

(1) in FIG. 16 shows a reflection factor in the case that the signal is transmitted to the uppermost layer from the lowermost layer by one through hole, and since the characteristic impedance corresponding to the transmission path of the through hole is designed such as to approximately coincide with the characteristic impedance of the wiring, the reflection factor is set to a small reflection factor. (2) in FIG. 16 shows a case that the board wiring connected to the through hole is constituted by the upper layer, and the large reflection in a minus direction is generated by the parasitic capacity of the stub portion of the through hole at this time. (3) in FIG. 16 shows a case of employing two through holes as in the embodiment in accordance with the present invention, and two through holes are connected on the lowermost layer. At this time, it is possible to confirm that the reflection amount becomes smaller on the basis of the effect of the present invention.

FIG. 17 shows a case that the board wiring exists in the intermediate layer portion of the board. The reflection due to the parasitic capacity of the stub portion is generated in (4) using one through hole. However, in the case of (4) using two through holes in accordance with the embodiment of the present invention, it is known that the reflection factor becomes small.

The embodiments in accordance with the present invention described above do not generate any new step in the board manufacturing process. In other words, since the board is manufactured while keeping the normal board manufacturing process, no cost increase is generated.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A multi-layer wiring board comprising:
  a plurality of board layers having a plurality of signal through holes formed therein and extending through a thickness of the board layers;
  a plurality of wiring layers included in the plurality of board layers, each wiring layer comprising board wiring for conducting electrical signals, some of the board wiring of the wiring layers being electrically connected to the signal through holes;
  at least a first signal through hole and a second signal through hole being electrically connected,
  the first signal through hole and the second signal through hole being adjacent to each other and separated by a distance less than the thickness of the board layers; and
  a structure in which end portions of both sides of the first and the second signal through holes are connected to each other by wiring on an outer layer,
  wherein the first signal through hole is connected to board wiring of a predetermined wiring layer, and the second signal through hole is configured to transmit a signal carried by the board wiring to components on the multi-layer wiring board.

* * * * *